United States Patent
Chang et al.

(10) Patent No.: US 8,730,067 B2
(45) Date of Patent: May 20, 2014

(54) OPTIMIZED MULTI-LEVEL FINITE STATE MACHINE WITH REDUNDANT DC NODES

(75) Inventors: Wu Chang, Sunnyvale, CA (US); Fan Zhang, Milpitas, CA (US); Ming Jin, Fremont, CA (US); Xuebin Wu, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 111 days.

(21) Appl. No.: 13/564,836

(22) Filed: Aug. 2, 2012

(65) Prior Publication Data

US 2014/0035692 A1    Feb. 6, 2014

(51) Int. Cl.
*H03M 5/14* (2006.01)

(52) U.S. Cl.
CPC .................................... *H03M 5/145* (2013.01)
USPC ........................................................... 341/58

(58) Field of Classification Search
CPC ................................ H03M 5/14; H03M 5/145
See application file for complete search history.

(56) References Cited

U.S. PATENT DOCUMENTS

| | | | | |
|---|---|---|---|---|
| 5,859,601 | A | * | 1/1999 | Moon et al. ............. 341/59 |
| 6,018,304 | A | * | 1/2000 | Bessios ................... 341/58 |
| 7,403,138 | B2 | | 7/2008 | Coene |
| 2009/0015446 | A1 | * | 1/2009 | Coene et al. ............ 341/59 |

* cited by examiner

*Primary Examiner* — Howard Williams
(74) *Attorney, Agent, or Firm* — Suiter Swantz pc llo

(57) ABSTRACT

A method and system for eliminating/suppressing long transition runs over a communications channel is disclosed. The method may include providing modulation coding based on a multi-level finite state machine (ML-FSM) having a periodic structure, the periodic structure being defined by a predetermined number of time frames. The ML-FSM may include a plurality of penalty-free edges for connecting nodes in one time frame to nodes at the same level in a subsequent time frame and a plurality of penalty edges for connecting nodes in one time frame to nodes at an upper level in the subsequent time frame. The method may further include utilizing the ML-FSM based modulation coding to facilitate data transmission over the communications channel.

20 Claims, 3 Drawing Sheets

500

502
Providing modulation coding based on a multi-level finite state machine (ML-FSM) having a periodic structure, the periodic structure being defined by a predetermined number of time frames, the ML-FSM including: a plurality of penalty-free edges for connecting nodes in one time frame to nodes at the same level in a subsequent time frame; a plurality of penalty edges for connecting nodes in one time frame to nodes at an upper level in the subsequent time frame; and a plurality of dropping edges for connecting nodes in a last time frame of the predetermined number of time frames to nodes at a lower level in a first time frame of the predetermined number of time frames 504
Utilizing the ML-FSM based modulation coding to facilitate data transmission over the communications channel

US 8,730,067 B2

OPTIMIZED MULTI-LEVEL FINITE STATE MACHINE WITH REDUNDANT DC NODES

TECHNICAL FIELD

Noon The present invention relates to the field of data processing and particularly to a method and system for eliminating long transition runs over communications channels.

BACKGROUND

Jitter noise as the major noise source in magnetic recording channel comes with the transitions in channel sequence. Transition distribution of the channel sequence mainly determines the channel noise level/signature, channel information rate and hence the final error rate performance. In high density magnetic recording devices, burst errors caused by long transitions runs are dominant in read channel. Maximum transition run (MTR) codes may be utilized as modulation codes in magnetic recording channel to eliminate these long transition runs. For example, a MTR(j) code may eliminate transition runs longer than j. However, MTR coded channels also suffer additional channel density penalty and performance degradation due to the code rate loss. For example, the code rate of a recording channel implementing a MTR(3) code is limited to 0.9468 or less.

Therein lies the need to provide a method and system for eliminating long transition runs in data processing without the aforementioned shortcomings.

SUMMARY

Accordingly, an embodiment of the present disclosure is directed to a method for suppressing long transition runs over a communications channel. The method may include providing modulation coding based on a multi-level finite state machine (ML-FSM) having a periodic structure, the periodic structure being defined by a predetermined number of time frames. The ML-FSM may include a plurality of penalty-free edges for connecting nodes in one time frame to nodes at the same level in a subsequent time frame and a plurality of penalty edges for connecting nodes in one time frame to nodes at an upper level in the subsequent time frame. The method may further include utilizing the ML-FSM based modulation coding to facilitate data transmission over the communications channel.

A further embodiment of the present disclosure is directed to a method for suppressing long transition runs over a communications channel. The method may include providing modulation coding based on a ML-FSM having a periodic structure, the periodic structure being defined by a predetermined number of time frames. The ML-FSM may include a plurality of penalty-free edges for connecting nodes in one time frame to nodes at the same level in a subsequent time frame, a plurality of penalty edges for connecting nodes in one time frame to nodes at an upper level in the subsequent time frame, and a plurality of dropping edges for connecting nodes in a last time frame of the predetermined number of time frames to nodes at a lower level in a first time frame of the predetermined number of time frames. The method may further include utilizing the ML-FSM based modulation coding to facilitate data transmission over the communications channel.

An additional embodiment of the present disclosure is directed to a computer-readable device having computer-executable instructions for performing a method for suppressing long transition runs over a communications channel. The method may include providing modulation coding based on a ML-FSM having a periodic structure. The ML-FSM may include a plurality of penalty-free edges for connecting nodes in one time frame to nodes at the same level in a subsequent time frame and a plurality of penalty edges for connecting nodes in one time frame to nodes at an upper level in the subsequent time frame. The method may further include utilizing the ML-FSM based modulation coding to facilitate data transmission over the communications channel.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

In data processing, channel capacity is a measurement that indicates the highest code rate an error control coding (ECC) can achieve while remaining error free at a receiver. Given a fixed ECC, one objective is to have higher mutual information rate (approaching channel capacity) to provide a better performance. By optimizing the source distribution, the channel mutual information rate may be optimized to be very close to the channel capacity. One of such optimizations is known as Markov source optimization introduced by Kavcic (A. Kavcic, "On the capacity of Markov sources over noisy channels," IEEE Proceeding of Global Communications Conference 2001, San Antonio, Tex., November 2001, pp. 2997-3001), which is incorporated herein by reference.

The present disclosure is directed to a method and system for eliminating/suppressing long transition runs over a communications channel. In accordance with the present disclosure, a multi-level finite state machine is utilized to match/mimic the transition run length distributions of an optimized Markov source. Similar to MTR codes, the multi-level finite state machine based modulation code is able to limit transition run lengths. In addition, the multi-level finite state machine based modulation code is able to suppress certain transitions in order to shape the transition distributions, therefore providing better performance compared to MTR codes.

Figure 1:
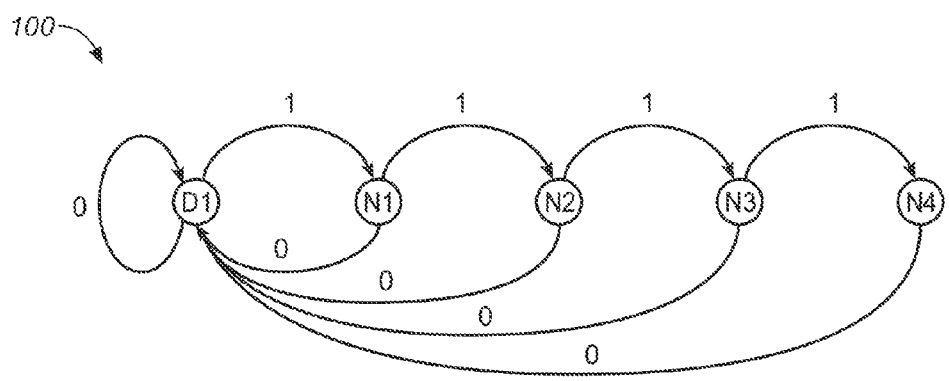
FIG. 1 is a graph notation depicting a MTR(4) code illustrated as a finite state machine.

It is understood that conventional MTR codes may be illustrated utilizing finite state machines (FSM). FIG. 1 is an illustration depicting a FSM with limited transition run length. More specifically, the transition run length of this exemplary FSM 100 is 4, which basically represents a MTR (4) code. As illustrated in FIG. 1, the FSM 100 may include 4 transition nodes N1, N2, N3 and N4 and a non-transition node (may also be referred to as DC node) D1.

Figure 2:
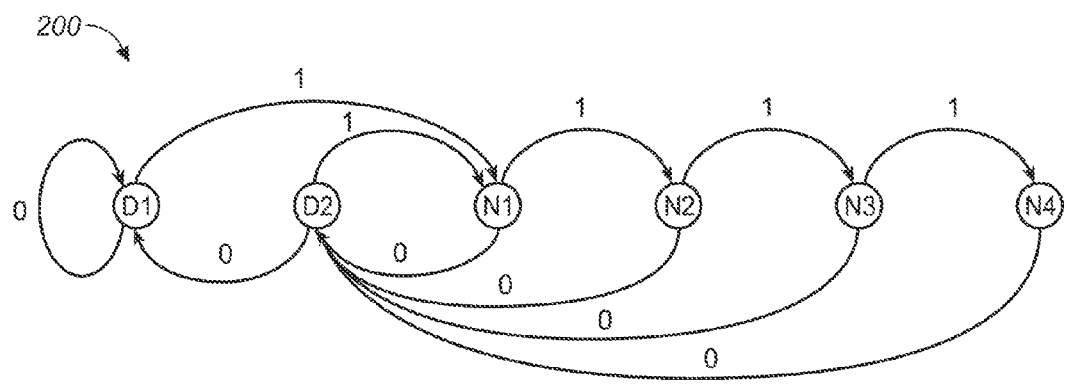
FIG. 2 is a graph notation depicting a finite state machine with redundant non-transition (DC) nodes.

Studies of the transition and non-transition (DC) properties of optimized Markov sources indicate that the error rate performance may benefit from reducing the probability of single DC in the channel sequence. Therefore, a FSM with redundant DC nodes (i.e., more than one DC node) is proposed in this disclosure. An exemplary FSM 200 with redundant DC nodes is shown in FIG. 2. Test results indicated that the FSM 200 with redundant DC nodes performs better than the basic MTR(j) because if there are two transition runs in the sequence, the redundant DC nodes in FSM 200 may separate them farther away from each other.

However, providing redundant DC nodes alone still may not be able to match/mimic the transition run length distributions of optimized Markov sources. That is, the FSMs with redundant DC nodes such as the FSM 200 described above still may not provide the transition distributions based suppression of long transitions. To achieve this transition distributions based suppression, a multi-level (ML) periodic structure is utilized to form the ML-FSM in accordance with the present disclosure.

Figure 3:
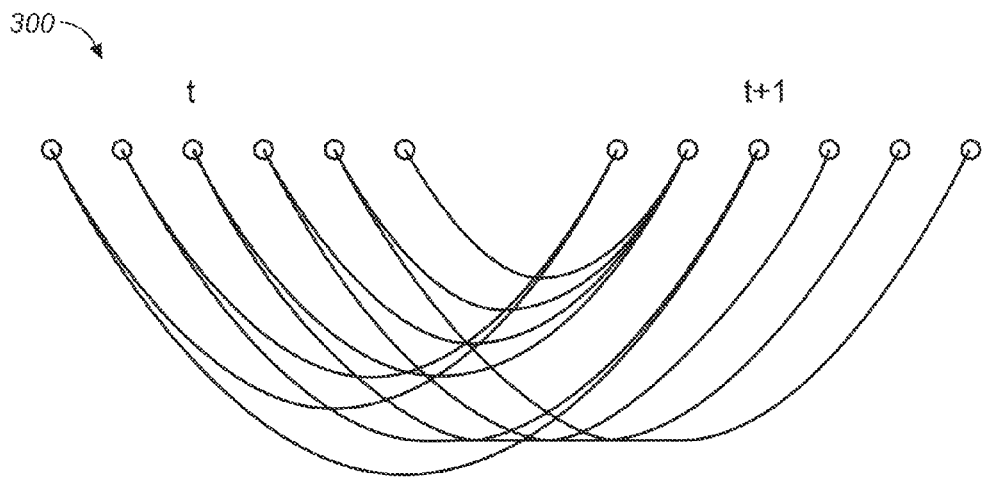
FIG. 3 is a graph notation depicting the finite state machine of FIG. 2 with a time line added.

Before illustrating the multi-level (ML) periodic structure, referring first to FIG. 3, an example of FSM 300 with a time line added is shown. FSM 300 is essentially the same as FSM 200, wherein the edges in FSM 300 indicates the possible state changes from time t to time t+1.

Figure 4:
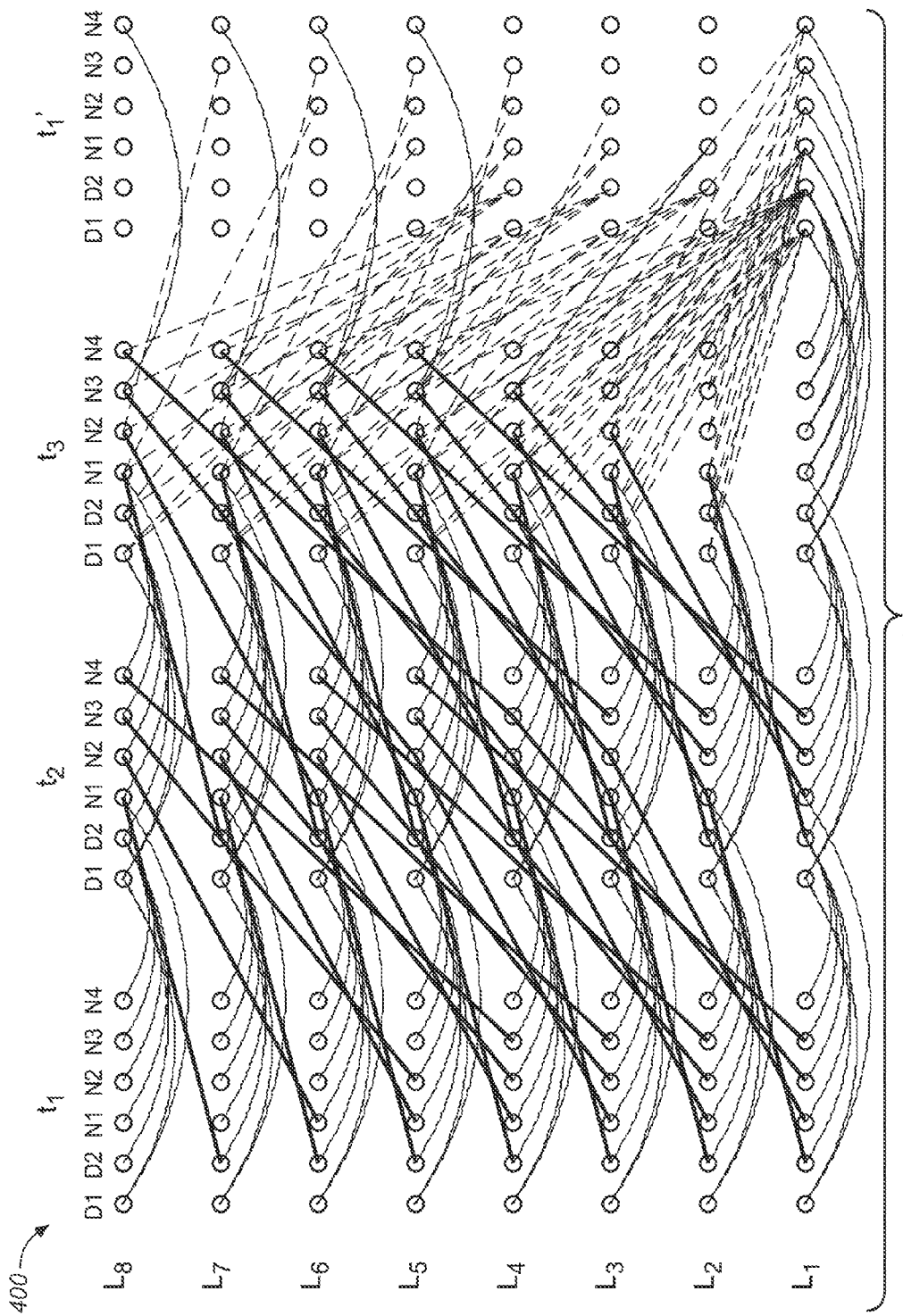
FIG. 4 is a graph notation depicting a multi-level finite state machine (ML-FSM) in accordance with the present disclosure.

Referring now to FIG. 4, a multi-level finite state machine (ML-FSM) 400 capable of suppressing long transitions in accordance with the present disclosure is shown. It is noted that ML-FSM 400 has a periodic structure. The periodic structure refers to the configuration that the ML-FSM is not for 1-bit output as the FSMs presented above. Instead, the ML-FSM is configured for a block of output, wherein the length of the block is referred to as the period of the ML-FSM. For example, the period of the ML-FSM 400 is 3, that is, the ML-FSM 400 is configured for 3-bit output, each bit corresponding to a particular time frame, and the edges going out of the nodes at time frame t1' essentially repeat the edges from t1 to t2.

The multiple levels defined in the ML-FSM are utilized to suppress certain transitions. The level goes up when the transitions which we want to suppress occur. Going up levels effectively add penalties on the transition patterns in the ML-FSM. In the exemplary ML-FSM 400, the penalties may range between 1 and 4. That is, certain transitions may force the level in the ML-FSM 400 to move up 1, 2, 3 or 4 levels. On the other hand, transitions that we do not necessarily want to suppress may remain at the same level in the ML-FSM 400.

More specifically, suppose a block starts from the lowest level l1 at t1. If the current state is D1, regardless whether the next state goes to a transition node (e.g., N1 at level 1 in t2) or a DC node (e.g., D2 at level 1 at t2), no penalty will be applied. However, if the current state is D2, no penalty will be applied only if the next state goes to a DC node (e.g., D1 at level 1 in t2); otherwise, a penalty of 1 will be applied if the next state goes to a transition node (e.g., N1 at level 2 in t2). Similarly, if the current state is N1, no penalty will be applied only if the next state goes to a DC node (e.g., D2 at level 1 in t2);

otherwise, a penalty of 2 will be applied if the next state goes to a transition node (e.g., N2 at level 3 in t2). Likewise, penalties of 3 or 4 may be applied if the current state is N2 or N3 and the next state goes to a transition node, respectively. It is understood that the notion of penalties (and going up levels) is the same for the rest of the ML-FSM.

The edges that connect nodes in one time frame to nodes at an upper level in a subsequent time frame may be referred to as penalty edges. As previously mentioned, the maximum number of levels a given penalty edge may go up to is bounded by the range of penalty (in this example, 4 is the maximum number of levels a penalty edge may go up to). On the other hand, the edges that connect nodes in one time frame to nodes at the same level in a subsequent time frame may be referred to as penalty-free edges.

It is noted that the nodes at the top level of the ML-FSM (e.g., level 8 in ML-FSM 400) are not associated with any penalty edges. In addition, penalty-free edges associated with the nodes at the top level of the ML-FSM are mostly connected to non-transition nodes in a subsequent time frame. Therefore, the more quickly the state machine moves to the top, the less likely that the next state will go to another transition node, effectively suppressing certain transitions. It is also noted that at the last time tick of the period (e.g., t3 in this example), the constraints may be relaxed by lowering the existing levels by a predetermined number. The lowering of the levels is referred to as a drop, and the edges that connect nodes in the last time frame of this period to nodes at a lower level in a subsequent time frame (i.e., the first time frame of the next period) is referred to as dropping edges. The drop essentially resets/lowers the levels accumulated by the existing period (block) and provides a relatively fresh start for the next period (block).

It is contemplated that the ML-FSM shown in FIG. 4 is merely exemplary. The number of levels, the length of the period, the number of transition nodes and the number of non-transition (DC) nodes may vary without departing from the spirit and scope of the present disclosure. It is also contemplated that the penalties associated with the various transitions shown in FIG. 4 are merely exemplary. The specific penalty associated with each node (i.e., the number of levels an edge goes up) may vary without departing from the spirit and scope of the present disclosure.

It is further contemplated that the ML-FSM to be utilized for a particular application may be selected using a selection process. The selection process may be an exhaust search process. One or more parameters such as the maximum penalty, the maximum number of levels and the length of the period may be predetermined prior to the search process. While there are many possible ML-FSMs available, several factors may be taken into consideration to select the suitable ones for the particular application. For instance, the selected ML-FSM must be able to satisfy a predetermined target code rate. In addition, the transition distribution of the selected ML-FSM may be approaching the transition run length distributions of an optimized Markov source. Other factors such as best suppression for long transitions and smallest total number of transitions may also be considered in the selection process.

Figure 5:
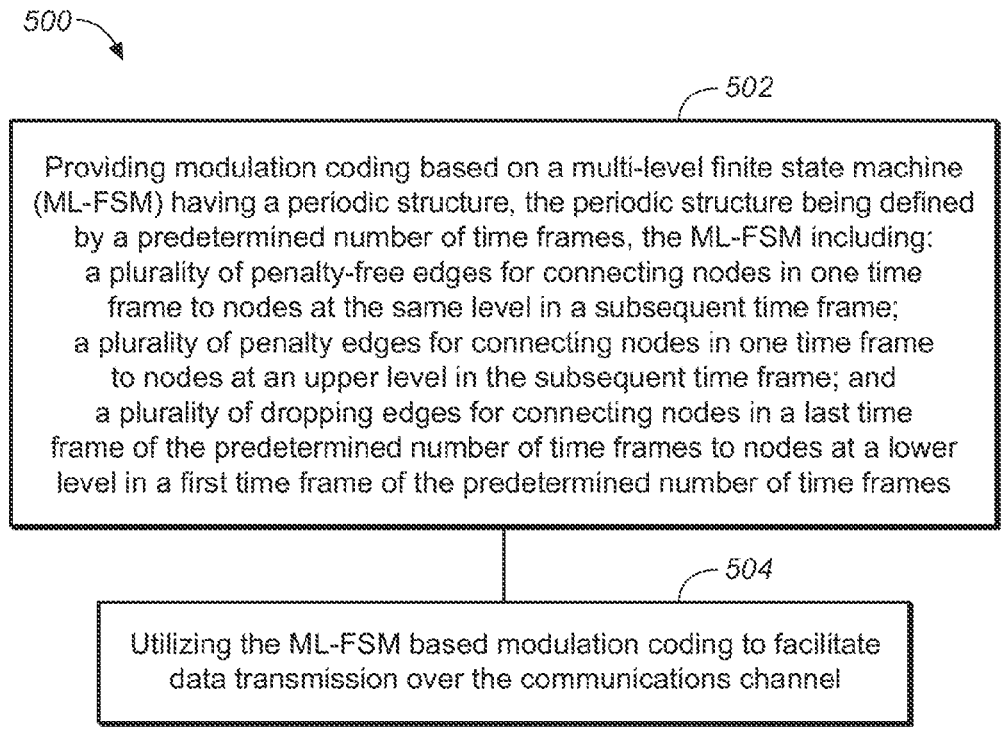
FIG. 5 is a flow diagram illustrating a method for suppressing long transition runs over a communications channel in accordance with the present disclosure.

Referring to FIG. 5, a flow diagram illustrating a method 500 for suppressing long transition runs over a communications channel is shown. Step 502 may provide modulation coding based on a multi-level finite state machine (ML-FSM) having a periodic structure as described above. The periodic structure of the ML-FSM is defined by a predetermined number of time frames. As depicted above, the ML-FSM may include: a plurality of penalty-free edges for connecting nodes in one time frame to nodes at the same level in a subsequent time frame; a plurality of penalty edges for connecting nodes in one time frame to nodes at an upper level in the subsequent time frame; and a plurality of dropping edges for connecting nodes in the last time frame to nodes at a lower level in the first time frame (of the next period).

Step 504 may utilize the ML-FSM based modulation coding provide to facilitate data transmissions over the communications channel. It is contemplated that the modulation coding in accordance with the present disclosure may be utilized in place of any run-length limited (RLL) coding or maximum transition run codes used in existing systems. The modulation coding in accordance with the present limit transition run lengths and suppress certain transitions in order to shape the transition distributions, therefore providing better performance compared to conventional codes.

Figure 6:
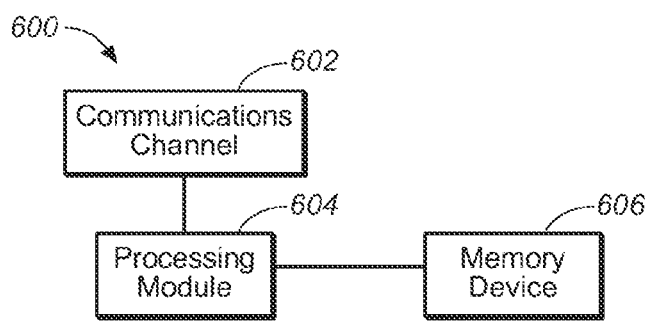
FIG. 6 is a block diagram illustrating a system for suppressing long transition runs over a communications channel in accordance with the present disclosure.

Referring to FIG. 6, a block diagram illustrating a system 600 for suppressing long transition runs over a communications channel 602 is shown. The communications channel 602 may be communicatively coupled with a processing module 604. The processing module 604 may be implemented as either a stand-alone or an integrated component of the communications channel 602. The processing module 604 includes a computer processor in communication with a memory device 606. The memory device 606 includes a computer-readable device having computer-executable instructions for performing the method 500 for suppressing long transition runs over the communications channel 602 as described above.

It is to be understood that the present disclosure may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for suppressing long transition runs over a communications channel, the method comprising:
   providing modulation coding based on a multi-level finite state machine (ML-FSM) having a periodic structure, the periodic structure being defined by a predetermined number of time frames, the ML-FSM including:
      a plurality of penalty-free edges for connecting nodes in one time frame to nodes at the same level in a subsequent time frame; and
      a plurality of penalty edges for connecting nodes in one time frame to nodes at an upper level in the subsequent time frame; and
   utilizing the ML-FSM based modulation coding to facilitate data transmission over the communications channel.

2. The method of claim 1, wherein each level in each time frame includes a plurality of non-transition nodes and a plurality of transition nodes.

3. The method of claim 1, wherein the plurality of non-transition nodes includes two non-transition nodes.

4. The method of claim 1, wherein nodes at a top level of the ML-FSM are not associated with any penalty edge.

5. The method of claim 1, wherein the ML-FSM further including:
   a plurality of dropping edges for connecting nodes in a last time frame of the predetermined number of time frames to nodes at a lower level in a first time frame of the predetermined number of time frames.

6. The method of claim 4, wherein a maximum drop applicable by each dropping edge is predetermined.

7. The method of claim 1, wherein a penalty applicable by each penalty edge is predetermined.

8. A method for suppressing long transition runs over a communications channel, the method comprising:
   providing modulation coding based on a multi-level finite state machine (ML-FSM) having a periodic structure, the periodic structure being defined by a predetermined number of time frames, the ML-FSM including:
      a plurality of penalty-free edges for connecting nodes in one time frame to nodes at the same level in a subsequent time frame;
      a plurality of penalty edges for connecting nodes in one time frame to nodes at an upper level in the subsequent time frame; and
      a plurality of dropping edges for connecting nodes in a last time frame of the predetermined number of time frames to nodes at a lower level in a first time frame of the predetermined number of time frames; and
   utilizing the ML-FSM based modulation coding to facilitate data transmission over the communications channel.

9. The method of claim 8, wherein each level in each time frame includes a plurality of non-transition nodes and a plurality of transition nodes.

10. The method of claim 8, wherein the plurality of non-transition nodes includes two non-transition nodes.

11. The method of claim 8, wherein nodes at a top level of the ML-FSM are not associated with any penalty edge.

12. The method of claim 8, wherein a maximum drop applicable by each dropping edge is predetermined.

13. The method of claim 8, wherein a penalty applicable by each penalty edge is predetermined.

14. A computer-readable device having computer-executable instructions for performing a method for suppressing long transition runs over a communications channel, the method comprising:
   providing modulation coding based on a multi-level finite state machine (ML-FSM) having a periodic structure, the periodic structure being defined by a predetermined number of time frames, the ML-FSM including:
      a plurality of penalty-free edges for connecting nodes in one time frame to nodes at the same level in a subsequent time frame; and a plurality of penalty edges for connecting nodes in one time frame to nodes at an upper level in the subsequent time frame; and utilizing the ML-FSM based modulation coding to facilitate data transmission over the communications channel.

15. The computer-readable device of claim 14, wherein each level in each time frame includes a plurality of non-transition nodes and a plurality of transition nodes.

16. The computer-readable device of claim 14, wherein the plurality of non-transition nodes includes two non-transition nodes.

17. The computer-readable device of claim 14, wherein nodes at a top level of the ML-FSM are not associated with any penalty edge.

18. The computer-readable device of claim 14, wherein the ML-FSM further including:
a plurality of dropping edges for connecting nodes in a last time frame of the predetermined number of time frames to nodes at a lower level in a first time frame of the predetermined number of time frames.

19. The computer-readable device of claim 18, wherein a maximum drop applicable by each dropping edge is predetermined.

20. The computer-readable device of claim 14, wherein a penalty applicable by each penalty edge is predetermined.

* * * * *